(12) United States Patent
Stegmüller

(10) Patent No.: US 6,263,140 B1
(45) Date of Patent: Jul. 17, 2001

(54) OPTOELECTRONIC MODULE

(75) Inventor: Bernhard Stegmüller, Augsburg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/331,267

(22) PCT Filed: Nov. 14, 1997

(86) PCT No.: PCT/DE97/02672

§ 371 Date: Jun. 17, 1999

§ 102(e) Date: Jun. 17, 1999

(87) PCT Pub. No.: WO98/27449

PCT Pub. Date: Jun. 25, 1998

(30) Foreign Application Priority Data

Dec. 17, 1996 (DE) .............................................. 196 52 533

(51) Int. Cl.⁷ ............................................................ G02B 6/10
(52) U.S. Cl. ........................ 385/131; 385/129; 385/130; 385/14; 385/141
(58) Field of Search ........................ 385/14, 88, 129, 385/130, 131, 132, 141

(56) References Cited

U.S. PATENT DOCUMENTS

| | | | | |
|---|---|---|---|---|
| 3,879,606 | * | 4/1975 | Bean | 385/131 X |
| 4,466,696 | * | 8/1984 | Carney | 385/49 X |
| 5,513,288 | * | 4/1996 | Mayer | 385/30 |
| 5,859,866 | * | 1/1999 | Forrest et al. | 372/50 |
| 5,887,116 | * | 3/1999 | Grote | 385/2 |
| 5,987,196 | * | 11/1999 | Noble | 385/14 |
| 6,034,983 | * | 3/2000 | Fuji et al. | 372/50 |
| 6,108,481 | * | 8/2000 | Tohyama et al. | 385/131 |
| 6,154,582 | * | 11/2000 | Bazylenko et al. | 385/14 |
| 6,160,945 | * | 12/2000 | Rhee et al. | 385/129 |

FOREIGN PATENT DOCUMENTS

| | | | | |
|---|---|---|---|---|
| 0 569 181 | | 11/1993 | (EP) | 383/131 X |
| 0569181-A1 | * | 11/1993 | (EP) | 385/131 X |
| 0 591 864 | | 4/1994 | (EP) | 385/88 X |
| 0591864-A2 | * | 4/1994 | (EP) | 385/88 X |
| 0696747-A2 | * | 8/1994 | (EP) | 385/131 X |
| 0696747-A3 | * | 8/1994 | (EP) | 385/131 X |
| 0 616 234 | | 9/1994 | (EP) | 385/131 X |
| 0616234-A2 | * | 9/1994 | (EP) | 385/131 X |
| 0616234-A3 | * | 1/1995 | (EP) | 385/131 X |
| 0 696 747 | | 2/1996 | (EP) | 385/131 X |
| WO 9827449-A2 | * | 6/1998 | (WO) | 385/131 X |

OTHER PUBLICATIONS

Ben–Michael et al. "A Bi–Directional . . . " IEEE Phot. Tech Lett. vol. 7, No. 12 Dec. 1995.*
Ido et al., "High–Speed MQW . . . " IEEE Phot. Tech Lett. vol. 7, No. 2 2/95.*
Ben–Michael et al, "A Bi–Directional Transceiver PIC for Ping–Pong Local Loop Configurations Operating at 1.3–μm Wavelength", *IEEE Photonics Technology Letters*, vol. 7, No. 12, Dec. 1995, pp. 1424–1426.
Ido et al, "High–Speed MQW Electroabsorption Optical Modulators Integrated with Low–Loss Waveguides", *IEEE Photonics Technology Letters*, vol. 7, No. 2, Feb. 1995, pp. 170–172.

* cited by examiner

*Primary Examiner*—Brian Healy
(74) *Attorney, Agent, or Firm*—Schiff Hardin & Waite

(57) ABSTRACT

Opto-electronic module, whereby opto-electronic, active components are manufactured as epitaxially grown layer sequence on the upper side of a substrate, and whereby the waveguide layers present in these components are connected to one another and/or to external terminal surfaces for external connection by passive waveguides that are composed of a material that differs from all semiconductor constituents of the active components.

7 Claims, 5 Drawing Sheets

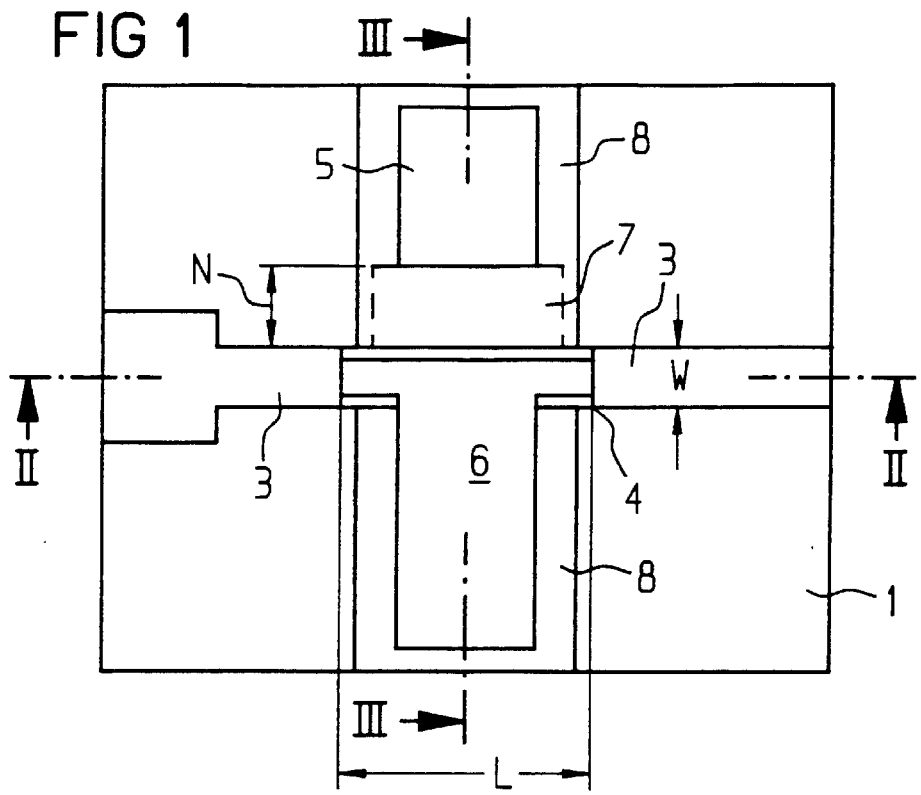
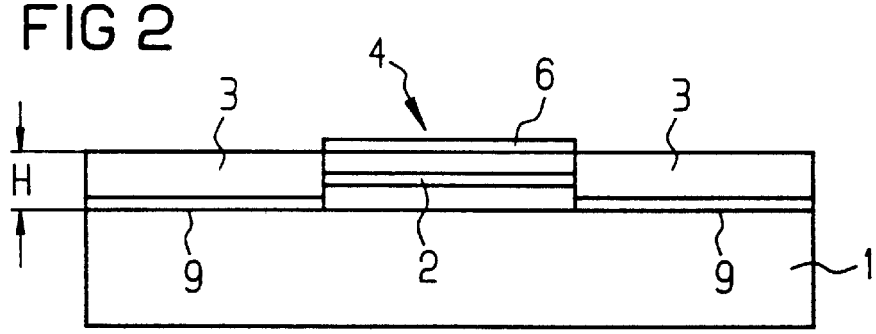
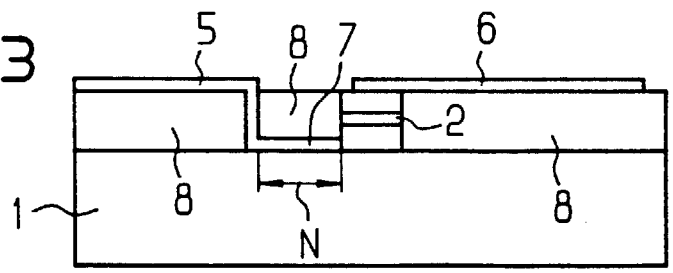

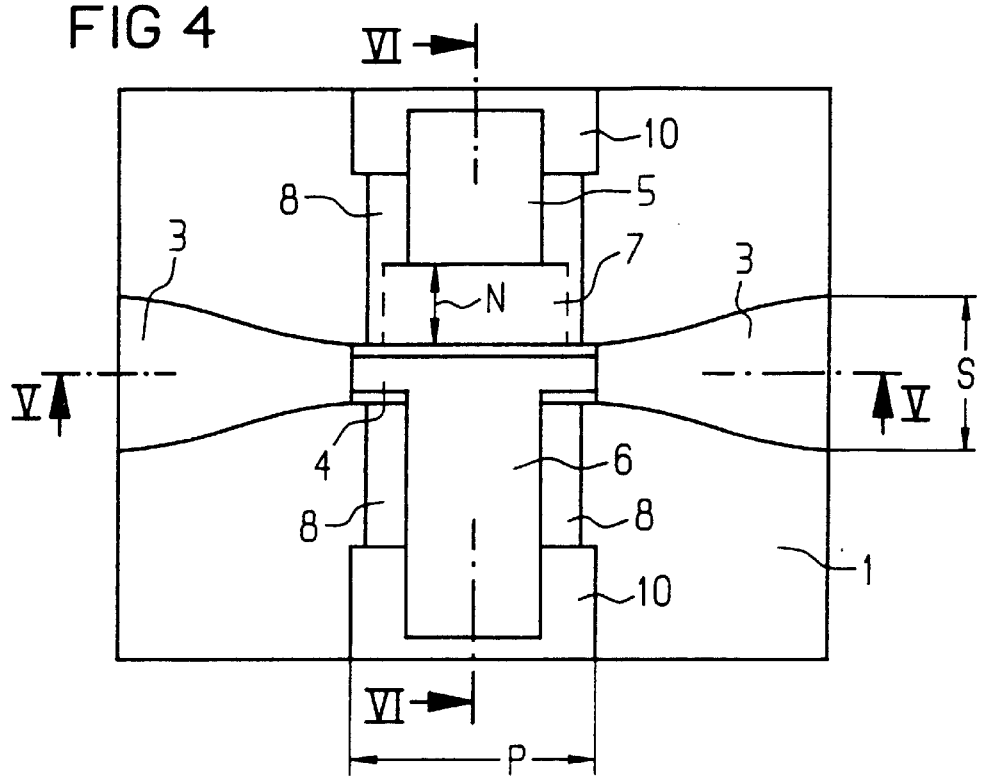
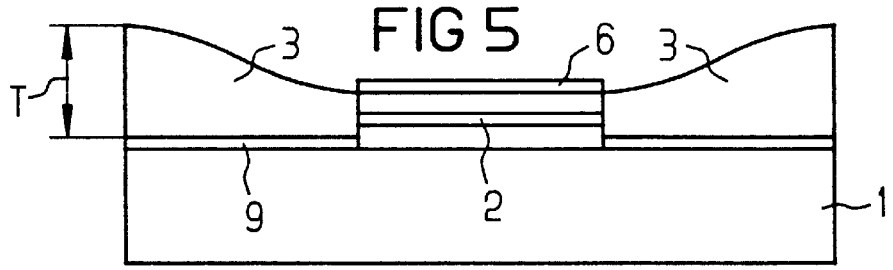
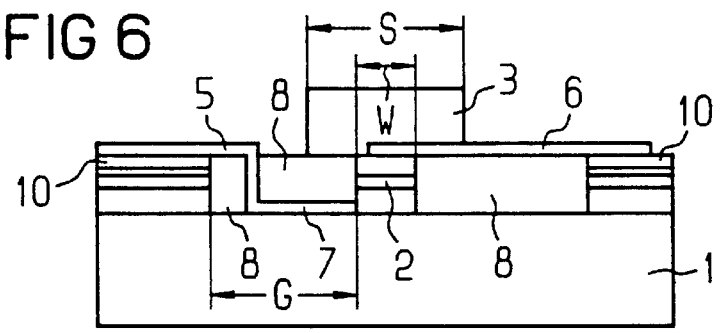

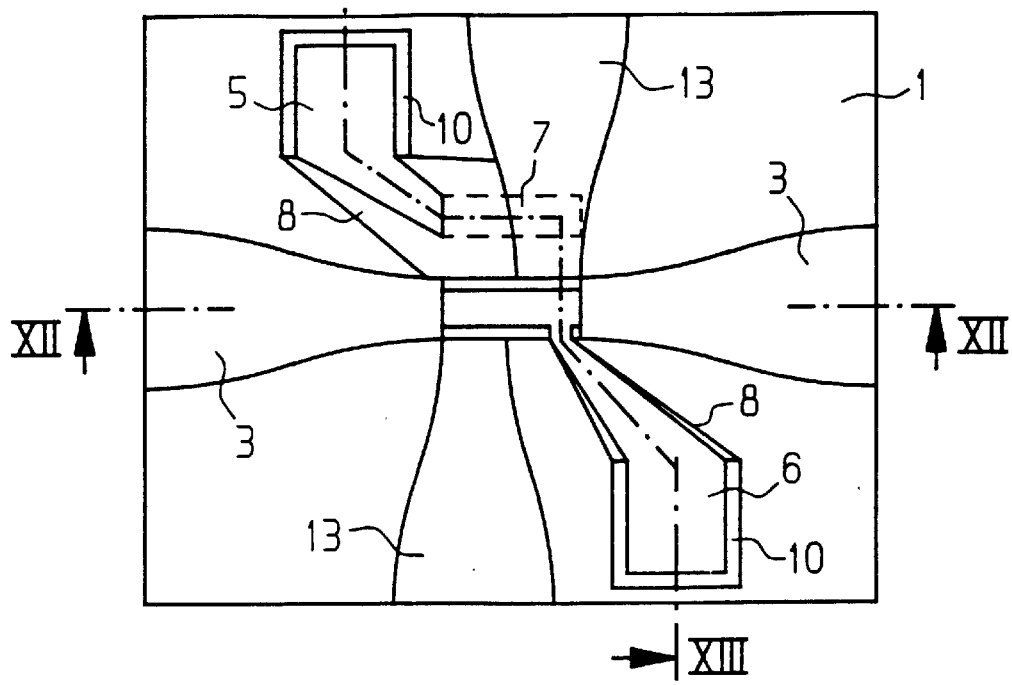
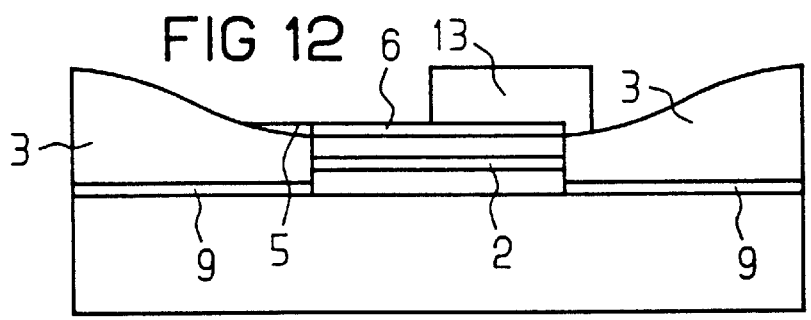
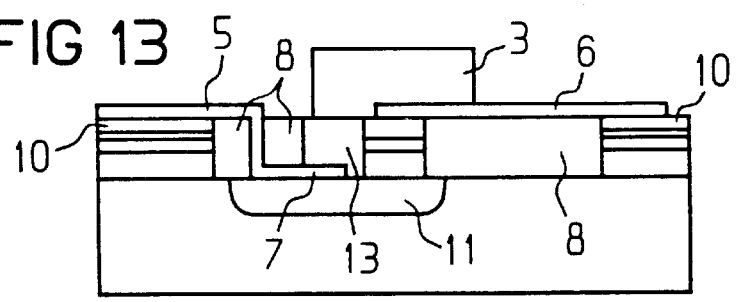

OPTOELECTRONIC MODULE

BACKGROUND OF THE INVENTION

The present invention is directed to an opto-electronic module for integration of active electro-optical components and passive waveguides for optical coupling to external waveguides.

The optical coupling between opto-electronic components critically determines the properties of opto-electronic systems or, respectively, the collaboration of these components with transmission media such as, for example, optical fibers connected thereto. The optical coupling should be optimally effective given simple and cost-beneficial technical realization. A monolithic integration with waveguides on substrates having larger dimensions is required given opto-electronic components having extremely small dimensions (below 100 $\mu$m) since a mechanical handling (transport or, respectively, mounting) of such individual micro-structure elements is possible only with difficulty or is even impossible. Arrangements wherein the active and the passive components are manufactured in the same material system have been proposed for such an optical coupling of active components and passive waveguides in, for example, the publication by T. Ido et al, "High-Speed MQW Electroabsorption Optical Modulators Integrated with Low-Loss Waveguides", in IEEE Photonics Technology Letters, Vol. 7, pp. 170 through 172 (1995) and in the publication by R. Ben-Michael et al, "A Bi-Directional Transceiver PIC for Ping-Pong Local Loop Configurations Operating at 1.3-$\mu$m Wavelength", in IEEE Photonics Technology Letters, Vol. 7, pp. 1424 through 1426 (1995). The installation of adiabatic tapers (sections of a waveguide tapering in one direction) also ensues upon employment of the same material components. The disadvantage is thereby that the manufacturing methods of such arrangements are extremely involved. In particular, they require multiple epitaxy steps and a considerable use of the semiconductor materials.

SUMMARY OF THE INVENTION

An object of the present invention is to specify an opto-electronic module in which active and passive components are integrated and that enables simple manufacture and handling.

This object is achieved with an optoelectronic module being provided on an upper surface of a substrate of semiconductor material. The upper surface has at least one electronic component with a longitudinal direction and a passive waveguide. The component is fashioned in a layer sequence grown epitaxially on the substrate with the layer sequence being formed by layers of a material selected from layers of semiconductor materials and mixed crystal compositions of one or more semiconductor materials. The passive waveguide is applied on the substrate as an integrated component part of the module and is arranged so that the waveguide couples radiation at a region of an optoelectronic component and at a terminal surface provided for external coupling with the waveguide conducting radiation between said region and said terminal surface. The passive waveguide is formed by a material that is formed on one or more constituents that are all different from every semiconductor material of the optoelectronic component. The component has an upper surface facing away from the substrate provided with a dielectric layer laterally with respect to the longitudinal direction of the component and at least one first contact on the dielectric layer and at least one second contact electrically connected to a lower layer of the component with the at least one second conductor having a lower part arranged laterally with respect to the lower direction of the component and a part applied on the dielectric layer.

Given the inventive module, the opto-electronic components that function as active components are fashioned as layer sequence epitaxially grown on a substrate. The epitaxial growth can ensue locally limited. Instead, a surface-wide layer sequence can be applied and can be subsequently re-etched locally limited. Passive waveguides are arranged in the free regions of the substrate surface, these passive waveguides connecting the active zones of the components to external terminal surfaces to which, for example, an optical fiber can be connected. What is critical for the inventive module is that the passive waveguides are composed of a material that does not belong to the material system that is employed for the active components.

The inventive module has the advantage that fundamentally all material systems can be employed that were previously employed for opto-electronic discrete components (for example, various compositions of InGaAsP, InGaAlAs, GaN, InGaAlP [sic], etc.). The layer structures required for the active components are grown on the substrates that are standard for the appertaining material system, whereby a substrate having relatively large dimensions can be selected. The layer sequences are grown laterally limited or etched back, so that the active components respectively occupy only a small portion of the substrate surface. The active components usually contain an optical waveguide that, for example, can be formed by the active layer of a laser diode or the like. Given an arrangement of the component in the interior of the substrate surface, this optical waveguide of the component does not extend up to the edge of the substrate and can therefore not be directly connected to external waveguides. Such a connection to external waveguides can also be made more difficult given a component arranged at the edge of the substrate surface in that the region of the waveguide provided in the component for the connection is too narrow for an efficient transition into an external waveguiding medium. Inventively, a passive waveguide is therefore proposed that produces the connection of the waveguide present in the active component with a terminal surface toward the outside. This passive waveguide can, in particular, be fashioned such that it connects relatively low and narrow to the active component and increasingly broadens in the plane of the substrate top and/or perpendicular thereto with increasing distance from the component and thus forms a type of taper that connects the narrow waveguide zone in the component to a terminal surface at the edge of the module that is clearly enlarged compared thereto. A plurality of waveguides can be connected to an active component. In particular, for example given a laser diode, a respective waveguide can be connected at both resonator end faces. In addition, waveguides can be connected to the active zone transversely relative to this longitudinal direction of the laser diode, for example in order to be able to control the beam propagation ensuing in the longitudinal direction of the laser diode.

Epitaxy processes such as, for example, MOVPE (metallo-organic vapor phase epitaxy), MBE (molecular beam epitaxy) or MOMBE (metallo-organic molecular beam epitaxy) can be utilized for manufacturing the optoelectronic components. The active components are laterally limited, for example, in that the layers are etched back. Standard etching techniques can be utilized for this. The components are covered with a mask, and the material in the region that is not covered is eroded by etching. Possible methods that can be utilized for this are, for example, IBE (ion beam etching), RIE (reactive ion beam etching), FIBE (focused ion beam etching), RIPE (resonant induced plasma etching), and CAIBE (chemical assisted ion beam etching). Instead of surface-wide growth and subsequent, local re-etching, it is possible to grow topically limited layer sequences by selective epitaxy. MOMBE or MOVPE can also be utilized for this.

The passive waveguides are manufactured in supplementary method steps. Inventively, materials are employed therefor that contain no constituents of the semiconductor materials employed for the active components. The passive waveguides therefore do not belong to the material system employed for the active components. This is also true when the active components in the module are manufactured of various material systems. The material of the passive waveguides fundamentally differs therefrom. Fundamentally all materials that are transparent for the radiation to be guided therein can be employed for the passive waveguides. Polyimides, bis-benzocyclobutene, silicon and/or silicon dioxide and other dielectric or materials transparent for operating wavelength preferably come into consideration. Mask and etching techniques are preferably utilized in the manufacture for structuring these passive waveguides, these techniques being respectively dependent on the material employed and being known per se. IBE, RIE, FIBE and RCE (resonant cyclotron etching) can be specifically employed. The thickness of the waveguides can be selected such (typically<10 $\mu$m) that taper structures can be produced both in the plane of the upper substrate side as well as perpendicular thereto (parallel or, respectively, perpendicular to the growth direction when growing the material). Such taper structures of passive material can be more simply and cost-beneficially manufactured then given employment of semiconductor material as employed for the active components.

For the purpose of waveguidance in the direction perpendicular to the upper substrate side, a reflective layer that, for example, can be metal (gold, silver), silicon or a dielectric can be inserted between the substrate material and the passive waveguide. This layer can also be formed by a layer structure composed of a plurality of layers. Dielectric materials such as, for example, $Al_2O_3$, $SiO_x$ or $SiN_x/Si$ can be employed for this purpose. InP, GaAs, GaP, GaN or $LiNbO_3$ come into consideration as substrate material.

BRIEF DESCRIPTION OF THE DRAWINGS

A more detailed description of various exemplary embodiments of an inventive module with reference to FIGS. 1 through 14 follows.

FIG. 1 is a plan view of an optoelectronic module according to the present invention;

FIG. 2 is a cross sectional view taken along the lines II—II of FIG. 1;

FIG. 3 is a cross sectional view taken along the lines III—III of FIG. 1;

FIG. 4 is a plan view of an embodiment of the module of the present invention;

FIG. 5 is a cross sectional view taken along the lines V—V of FIG. 4;

FIG. 6 is a cross sectional view taken along the lines VI—VI of FIG. 4;

FIG. 11 is a plan view of a still further embodiment of the module of the present invention;

FIG. 12 is a cross sectional view taken along the lines XII—XII of FIG. 11;

FIG. 13 is a cross sectional view taken along the lines XIII—XIII of FIG. 11.

DESCRIPTION OF THE PREFERRED EMBODIMENTS

Figure 7:
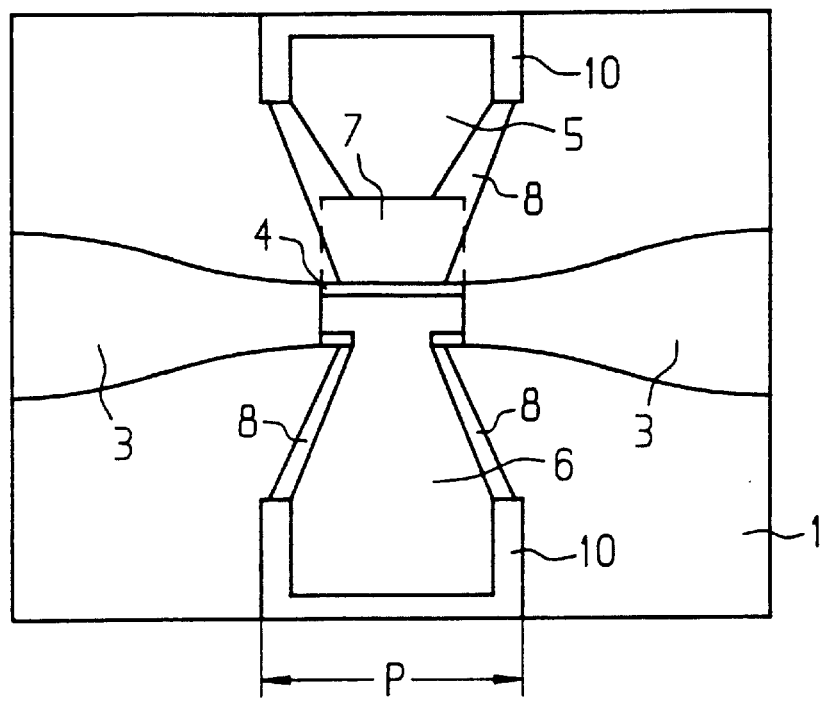
FIG. 7 is a plan view of another embodiment of the module of the present invention.

Given the arrangement shown in FIG. 1, an active component 4 is located on the upper side or surface of a substrate 1. Passive waveguides 3 follow in longitudinal direction of this component. Contacts 5, 6 provided for current injection are supplied provided laterally to this longitudinal direction. In the illustrated example, the one contact 5 is applied on a dielectric layer 8 and is conducted down onto the upper substrate side or surface adjacent to the component 4. The lower part 7 of the contact 5 can be covered with the dielectric 8 and is therefore shown with broken lines in FIG. 1 as a covered contour. A second contact 6 is likewise located on a dielectric layer 8 and is conducted onto the upper side of the component 4.

FIG. 2 shows the cross-section entered in FIG. 1. The component 4 with a waveguide layer 2 that, for example, can be the active layer of a light-generating component is located on the substrate 1. In this example, the contact 6 on the upper side is present over the entire length of the component 4. Waveguides 3 that, in this example, are separated from the substrate 1 by a layer 9 that improves the waveguidance follow at both sides in longitudinal direction of the component. This layer 9 can also be omitted. FIG. 3 shows the other cross-section entered in FIG. 1 transversely relative to the longitudinal direction of the component. Both contacts 5, 6 are therefore visible in FIG. 3. The contact 5 is conducted down in a step onto the upper surface of the substrate 1. The lower part 7 of the contact 5 is conducted down to a lower layer of the component, so that current can be applied to the component.

Typical dimensions given this arrangement are, for example, as follows:

Length L of the component between 1 $\mu$m and 600 $\mu$m,
Width W of the component between 0.1 $\mu$m and 40 $\mu$m,
Dimension N of the lower part 7 of the contact 5 roughly between 10 $\mu$m and 20 $\mu$m, and
Height H of the component between 2 $\mu$m and 10 $\mu$m.

The passive waveguides 3 preferably has the lateral dimension of the component, i.e. thus likewise has the width W. The waveguide that is entered at the left-hand side in FIG. 1 is shown there as an example having an abrupt broadened portion. Such a broadened portion can, for example, be provided for an improved connection to an external waveguide.

Given the alternative exemplary embodiment of FIG. 4, portions of the layer structure that was grown for the component 4 and that are covered with an insulation layer 10 in this example have been left standing spaced from the component. It therefore suffices when the dielectric layer 8 is applied only in the region between the component and these remaining parts. The waveguides 3 are implemented as taper in this example. The waveguides broaden toward the edge of the substrate both perpendicular to the upper surface of the substrate 1 as well as in the plane of this upper surface. The broadening of the waveguides, instead, can be present only in the plane of the substrate surface or only perpendicular to this upper surface.

FIG. 5 shows the cross-section entered in FIG. 4. An additional layer 9 provided for the waveguidance is again present between the substrate 1 and the waveguides 3; this additional layer 9 can also be omitted here. From the height of the component, the vertical dimension of the waveguide 3 increases up to the highest value T at the edge of the substrate. This height T of the taper-like broadened portion of the waveguide amounts, for example, to between 2 $\mu$m and 12 $\mu$m.

The other cross-section entered in FIG. 4 is shown in FIG. 6. An insulation layer 10 is respectively present between the contacts 5, 6 and the remaining parts of the layer sequence provided for the component. The waveguide 3 comprises the rectangular contour that has been entered in the direction of view. The width W of the component also amounts, for example, to between 0.1 $\mu$m and 4 $\mu$m here. The maximum width S of the waveguide table preferably amounts to between 0.1 $\mu$m and 12 $\mu$m. The dimensions of the dielectric layer 8 between the portions of the epitaxially grown layer structure, entered as spacing G in FIG. 6, amounts, for example, to between 10 $\mu$m and 200 $\mu$m. The dimension N of the lower portion 7 of the contact 5 also preferably amounts to roughly 10 $\mu$m through 20 $\mu$m. The lateral dimension P of the remaining portions of the layer sequence on which the contacts are applied amounts, for example, to 50 $\mu$m through 600 $\mu$m.

In the embodiment of FIG. 7, the dimension P is greater then the length of the component. The contacts 5, 6 and the layers of dielectric 8 taper in the direction toward the component 4. Large terminal surfaces for the contacts 5, 6 are thus obtained even given small components.

Figure 8:
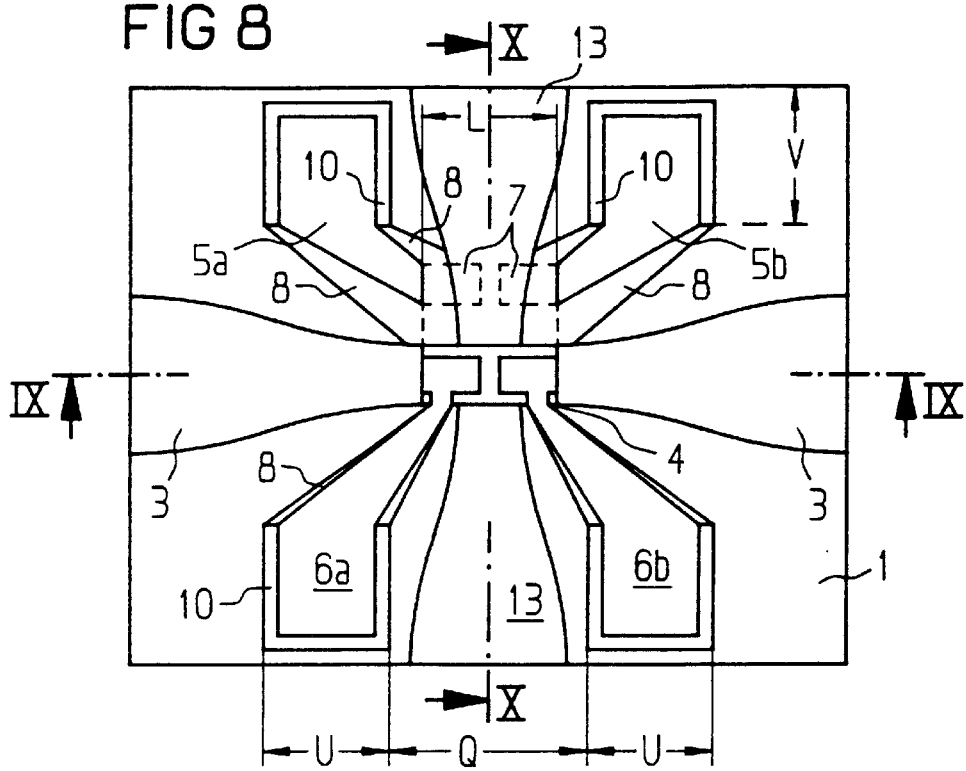
FIG. 8 is a plan view of yet another embodiment of the module of the present invention.

Given the exemplary embodiment of FIG. 8, passive waveguides 13 are also connected to the waveguide layer 2 of the component transversely relative to the longitudinal direction of the component 4. The arrangement of the waveguides 3, 13 with respect to the component 4 is selected symmetrical here. The contacts 5a, 5b, 6a, 6b are respectively formed bipartite here. They are applied partially on remaining portions of the layer sequence that was grown and separated therefrom by an insulation layer 10 and partially on a dielectric layer 8. Both portions of a contact 5a, 5b are conducted down to the underside of the component onto the upper side of the substrate. These lower portions 7, however, are arranged at a slight distance from the component here as an example. The electrically conductive connection to the component is produced here, for example, in that an electrically conductively doped region is formed in the upper side of the substrate, the lower portions 7 of the contacts 5a, 5b being electrically conductively connected thereover to a lowest layer of the component 4. The contact 6a, 6b applied on the upper side or surface of the component is likewise implemented bipartite here and is partially applied on an insulation layer 10 over residues of the layer sequence and partially on a dielectric layer 8.

Figure 9:
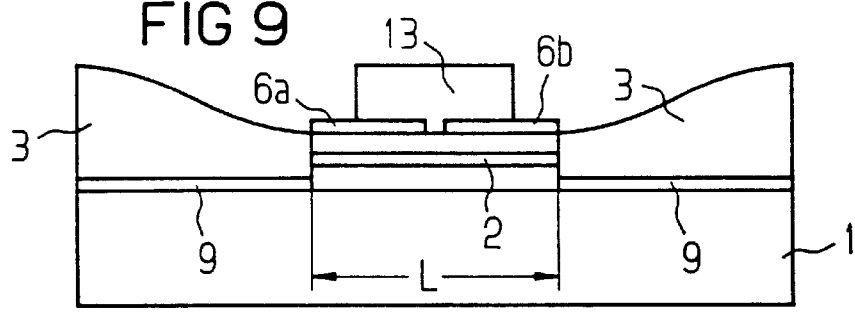
FIG. 9 is a cross sectional view taken along the lines IX—IX of FIG. 8.
Figure 10:
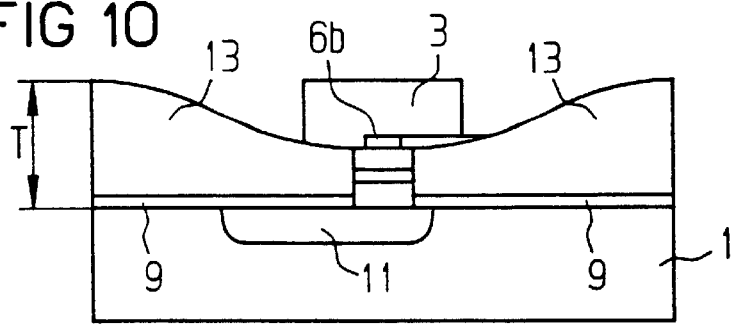
FIG. 10 is a cross sectional view taken along the lines X—X of FIG. 8.

FIG. 9 shows the cross-section entered in FIG. 8 wherein the two separate portions of the contact 6a, 6b can be seen on the upper surface of the component. The other components correspond to those in the exemplary embodiment of FIG. 5. FIG. 10 shows the other cross-section entered in FIG. 8 wherein, in the direction of view, the one contact 6b can be seen on the upper surface of the component and the outer contour of the waveguide taper 3 can be seen. A doped region that is provided for the described electrical connection between the portions 7 of the contact 5a, 5b and the component is entered in the substrate. Given the presence of the entered layer 9, which is intended to improve the waveguidance toward the substrate, this layer is either fashioned electrically conductive or is omitted between the portions 7 of the contact and the doped region 11.

The dimensions entered in FIGS. 8 through 10 are as follows:

Length L of the component, for example, between 1 $\mu$m and 600 $\mu$m, the dimensions U and V of the remaining layer portions are, for example, 50 $\mu$m through 200 $\mu$m, maximum height T of the waveguide taper, for example, between 2 $\mu$m and 12 $\mu$m, and the spacing Q between the residues of the epitaxially grown layers on which the two portions of a contact are respectively applied, for example, at most 100 $\mu$m.

In the exemplary embodiment of FIG. 11, the additional waveguides 13 are offset relative to one another in the longitudinal direction of the component. The contacts 5, 6 are one-piece here and are applied with terminal surfaces offset relative to one another in the longitudinal direction of the component. FIG. 12 and FIG. 13 show the cross-sections entered in FIG. 11, whereby the parts visible in the direction of the view perpendicular to the entered section lines have also been respectively entered. Thus, a short section of the contact 5 and the contour of the waveguide taper 13 in the direction of view can be seen in FIG. 12. Due to the multiple directional change of the section line of the cross-section of FIG. 13, the passive waveguide 13 entered at the top in FIG. 11 is omitted in the cross-section of FIG. 13 for the sake of clarity. The view presented in FIG. 13 therefore corresponds to an exemplary embodiment wherein the waveguide 13 broadens toward the outside only in the plane of the upper surface of the substrate but no perpendicularly thereto. The dielectric layer 8 partially covers the lower portion 7 of the contact 5. The rest of the lower portion 7 of the contact 5, which is located under the waveguide 13 is only covered by the waveguide 13, as can be seen in FIG. 13.

Figure 14:
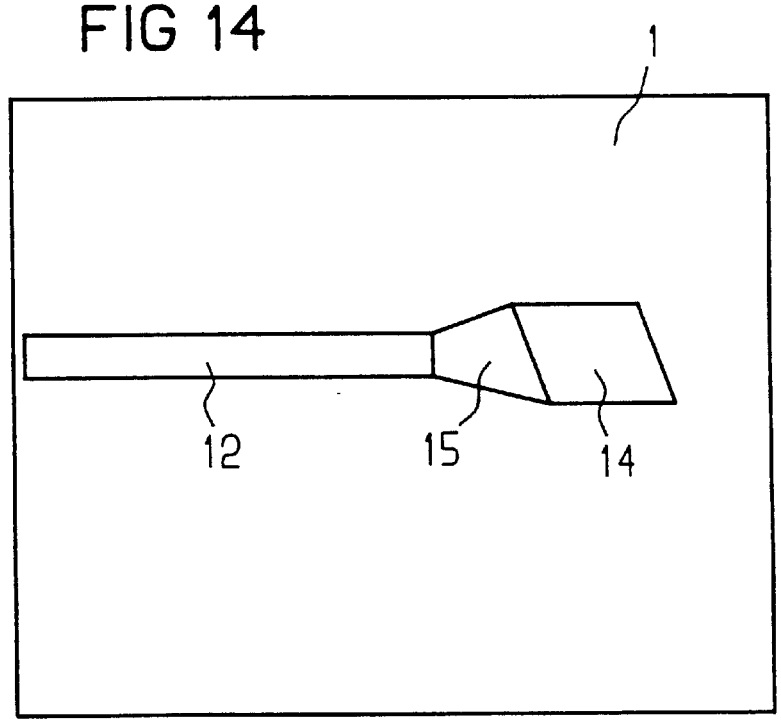
FIG. 14 is a plan view of a still further embodiment of the module of the present invention.

FIG. 14 shows a further exemplary embodiment of the inventive module, whereby two different active components 12 and 14 are connected to one another by a passive waveguide 15 of a different material. The component 12 can, for example, be a laser diode and the component 14 can be a photodiode. The different dimensions of the waveguide layers present in the components are compensated by a taper-shaped, passive waveguide 15.

The inventive modules are especially advantageous for utilization given hybrid integration of passive waveguides or networks, since a complicated adjustment of the components can be foregone and only a simple placement is necessary (pick-and-place technique).

What is claimed is:

1. An optoelectronic module comprising a substrate of semiconductor material with an upper surface, at least one optoelectronic component with a longitudinal direction and a passive waveguide being arranged on said upper surface, said component being fashioned in a layer sequence grown epitaxially on the substrate, said layer sequence being formed by layers selected from a group of layers of semiconductor material and layers of mixed crystal compositions of at least one semiconductor material, said passive waveguide being applied on the substrate as an integrated component part of the module and being arranged so that it couples radiation with a region of the optoelectronic component and couples radiation with an external terminal surface with the waveguide conducting radiation between said region and said terminal surface, said passive waveguide being formed by a constituent different from every semiconductor material in the optoelectronic component, at least one first contact being applied on an upper surface of the component facing away from the substrate and on a dielectric layer extending laterally with respect to the longitudinal direction of the component and at least one second contact being electrically connected to a lower layer of the component, said at least one second contact having a lower part arranged laterally with respect to the longitudinal direction of the component and a part applied on said dielectric layer.

2. Module according to claim 1, wherein whereby the passive waveguide is polyimide.

3. Module according to claim 1, wherein whereby the passive waveguide is bis-benzocyclobutene.

4. An optoelectronic module according to claim 1, wherein at least a part of one of the first contact and the second contact is arranged on an insulating layer being provided on at least a remaining part of the epitaxially grown layer sequence separated from the component.

5. An optoelectronic module according to claim 1, which includes a structure being arranged between the passive waveguide and the upper surface of the substrate for improving wave guidance in the waveguide, said structure being selected from a group consisting of a reflective layer and a layer structure.

6. An optoelectronic module according to claim 1, which includes at least two optoelectronic components being separated from one another on the upper surface of the substrate and being fashioned in a layer sequence epitaxially grown on said upper surface, the passive waveguide being formed by a material that is formed of one or more constituents which is different from the semiconductor material of the optoelectronic components, said passive waveguide connecting regions of said optoelectronic components to one another.

7. An optoelectronic module according to claim 1, which includes a plurality of passive waveguides being present, each passive waveguide being formed of a material that is different from every semiconductor material in the optoelectronic component, and said at least two passive waveguides being conducted to the same optoelectronic component.

* * * * *